(12) United States Patent
Hsu et al.

(10) Patent No.: US 12,306,277 B2
(45) Date of Patent: May 20, 2025

(54) METHOD AND APPARATUS FOR QUANTITATIVE DETECTION OF PARAMETERS IN MRI, AND MAGNETIC RESONANCE SCANNER

(71) Applicant: Siemens Healthineers AG, Forchheim (DE)

(72) Inventors: Yi-Cheng Hsu, Taipei (TW); Ying Hua Chu, Taipei (TW); Patrick Liebig, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 49 days.

(21) Appl. No.: 18/127,843

(22) Filed: Mar. 29, 2023

(65) Prior Publication Data

US 2023/0349993 A1 Nov. 2, 2023

(30) Foreign Application Priority Data

Mar. 30, 2022 (CN) .......................... 202210326167.1

(51) Int. Cl.
*G01R 33/50* (2006.01)
*G01R 33/561* (2006.01)

(52) U.S. Cl.
CPC ......... *G01R 33/50* (2013.01); *G01R 33/5615* (2013.01)

(58) Field of Classification Search
CPC .............. G01R 33/50; G01R 33/5615; G01R 33/5613; G01R 33/5616; G01R 33/5618
See application file for complete search history.

(56) References Cited

U.S. PATENT DOCUMENTS

2011/0025327 A1\* 2/2011 Deoni .................... G01R 33/50
324/309
2012/0326721 A1 12/2012 Remmele et al.
(Continued)

FOREIGN PATENT DOCUMENTS

| CN | 110133553 A | 8/2019 |
| WO | 2011114264 A1 | 9/2011 |
| WO | 2018088096 A1 | 5/2018 |

OTHER PUBLICATIONS

Kang Ning et al.: "Quantitative Magnetic Resonance Imaging of Spin Density, Relaxation Times T1 and T2," Chin J Med Imaging Technol, 2004, vol. 20, No. 12, p. 1944-1947, Dec. 20, 2004. (w/English Abstract).

*Primary Examiner* — G. M. A Hyder
(74) *Attorney, Agent, or Firm* — Banner & Witcoff Ltd.

(57) ABSTRACT

In a method for quantitative detection of parameters in MRI, first and second spoiled gradient echo images and at least one multi-echo steady-state first/second magnetization image are acquired; based on the extended phase graph theory, signal equations are obtained corresponding to the first and second spoiled gradient echo images, the at least one multi-echo steady-state first magnetization image and the at least one multi-echo steady-state second magnetization image; based on the signal equations of the first and second spoiled gradient echo images, the signal equation of the at least one multi-echo steady-state first magnetization image and the signal equation of the at least one multi-echo steady-state second magnetization image, a spoiled gradient echo proton density map, a multi-echo steady-state proton density map, a longitudinal relaxation time map and a transverse relaxation time map of the target tissue are obtained.

15 Claims, 4 Drawing Sheets

(56) References Cited

U.S. PATENT DOCUMENTS

| | | | |
|---|---|---|---|
| 2014/0292325 A1 | 10/2014 | Heule et al. | |
| 2017/0345149 A1* | 11/2017 | Warntjes | A61B 5/0042 |
| 2019/0250231 A1 | 8/2019 | Taniguchi et al. | |
| 2020/0057128 A1* | 2/2020 | Teixeira | G01R 33/4616 |
| 2022/0057463 A1 | 2/2022 | He et al. | |
| 2023/0314535 A1* | 10/2023 | Hsu | G01R 33/50 |

* cited by examiner

METHOD AND APPARATUS FOR QUANTITATIVE DETECTION OF PARAMETERS IN MRI, AND MAGNETIC RESONANCE SCANNER

CROSS REFERENCE TO RELATED APPLICATIONS

This patent application claims priority to Chinese Patent Application No. 202210326167.1, filed Mar. 30, 2022, which is incorporated herein by reference in its entirety.

BACKGROUND

Field

The present disclosure relates to the technical field of MR (magnetic resonance), in particular to a method and apparatus for quantitative detection of parameters in MRI (magnetic resonance imaging), and an MR scanner.

Related Art

Quantitative MRI separates specific tissue characteristics from the influence of MR parameters, assisting in early disease detection, comparative research and monitoring of treatment. In addition, a good quantitative image relies on the protocol and scanner to a certain degree, and may be used for machine learning diagnosis, with no need to perform retraining for different protocols and hardware. A conventional weighted image may also be synthesized from T1 (longitudinal relaxation time), T2 (transverse relaxation time) and PD (proton density) images. Accurate and effective extraction of these features in MRI is the key to clinical applications.

The following are examples of conventional quantitative MRI methods:

Method 1: Gold Standard T1 Mapping Method

This method measures T1 based on IR (inversion recovery) of a series of different inversion times. The signal strength $S_n(v)$ and the inversion time $TI_n$ are linked by the following equation (1):

$$S_n(v) = a(v) + b(v) \cdot \exp(-TI_n/T1(v)) \quad (1)$$

where v denotes the sequence number of a voxel on target tissue, n is the sequence number of inversion time, $S_n(v)$ is the strength of the MR signal of voxel v of the target tissue based on the nth inversion time, a(v) and b(v) are a first parameter and a second parameter, $TI_n$ is the nth inversion time, T1(v) is the longitudinal relaxation time of voxel v of the target tissue, and expo is the exponential function with the natural constant e as the base.

A drawback of this method is that it requires a long scan time, with only one phase encoding being sampled per long TR (repetition time). To increase the efficiency of clinical applications, an improved T1 mapping method obtains multiple phase/partition encodings at different inversion times within the TR, but at the cost of reduced precision and the phenomenon of point spread in the reconstructed image; for example, in T1 mapping, multiple readings after one IR will change the longitudinal magnetization recovery curve thereof.

Method 2: Gold Standard T2 Mapping Method

This method measures T2 based on spin echoes of a series of different TE (echo times). The signal strength $S_n(v)$ and $TE_n$ are related in the following way:

$$S_n(v) = c(v) \cdot \exp(-TE_n/T2(v)) \quad (2)$$

where v denotes the sequence number of a voxel on target tissue, n is the sequence number of TE, $S_n(v)$ is the strength of the MR signal of voxel v of the target tissue based on the nth TE, c(v) is a first parameter, $TE_n$ is the nth TE, and T2(v) is the transverse relaxation time of voxel v of the target tissue.

The limitation of this method also lies in the fact that the scan time needed is long, with one phase encoding being sampled in one TE only per TR. To speed up acquisition, multiple spin echoes may be acquired per TR; this is called MESE (multi-echo spin echo), but precision must be sacrificed. If an excited echo results in an inaccurate flip angle, the acquisition of multiple spin echoes in one TR will not be able to accurately reflect T2.

Method 3: to further increase the acquisition speed, a model-based method has also been proposed in the prior art; this method achieves a ten-fold acceleration with slight signal-to-noise ratio loss.

This method still requires a long TR, and generally acquires a 2D image; this reduces precision due to an imperfect slice profile.

Method 4: a mapping method using a group of parameters acquired on the basis of SSFP (steady-state free precession sequence).

This method first acquires SPGR (SPoiled Gradient Recalled echo, spoiled gradient echo) images with two different flip angles, then establishes the following approximate formula (3) for the SPGR images with two different flip angles respectively:

$$S(v) \approx M_0(v) \cdot ((1-E_1(v))/(1-E_1(v) \cdot \cos \alpha)) \cdot \sin \alpha \quad (3)$$

where $E_1 = \exp(-TR/T1(v))$ v denotes the sequence number of a voxel on target tissue, S(v) is the strength of the SPGR signal of voxel v of the target tissue, $M_0(v)$ is the proton density of voxel v of the target tissue, α is the flip angle, TR is the repetition time, and T1(v) is the longitudinal relaxation time of voxel v of the target tissue.

By establishing two formulae (3) for the SPGR images with two different flip angles, it is possible to compute approximate values of $M_0(v)$ and T1(v).

Then, for an unspoiled non-equilibrium steady-state signal, a DESS (dual echo steady state) sequence is used; the magnetization signal formed just after excitation is denoted $F_0$, and the magnetization signal refocussed just before excitation is denoted $F_{-1}$:

with a large flip angle:

$$F_0(v) = M_0(v) \cdot \tan\left(\frac{\alpha}{2}\right) \cdot (1 - (E_1(v) - \cos \alpha) \cdot r(v)) \quad (4)$$

$$F_{-1}(v) = M_0(v) \cdot \tan\left(\frac{\alpha}{2}\right) \cdot (1 - (1 - E_1(v) \cdot \cos \alpha) \cdot r(v)) \quad (5)$$

where:

$$E_1(v) = \exp\left(\frac{-TR}{T1(v)}\right) \quad (6)$$

$$E_2(v) = \exp\left(\frac{-TR}{T2(v)}\right)$$

$$p(v) = 1 - E_1(v)\cos \alpha - E_2^2(v)(E_1(v) - \cos \alpha)$$

-continued $$q(v) = E_2(v)(1 - E_1(v))(1 + \cos\alpha)$$

$$r(v) = (1 - E_2^2(v))(p^2(v) - q^2(v))^{\frac{-1}{2}}$$

$$\frac{F_{-1}(v)}{F_0(v)} \approx E_2^2(v)$$

v denotes the sequence number of a voxel on target tissue, $F_0(v)$ is the strength of the magnetization signal formed just after excitation of voxel v of the target tissue, $M_0(v)$ is the proton density of voxel v of the target tissue, $F_{-1}(v)$ is the magnetization signal refocussed just before excitation of voxel v of the target tissue, TR is the repetition time, T1(v) is the longitudinal relaxation time of voxel v of the target tissue, and T2(v) is the transverse relaxation time of voxel v of the target tissue.

By substituting $M_0(v)$ and T1(v) estimated by formula (3) into formulae (4)-(6) above, T2(v) can be approximately estimated.

This method 4 can estimate T1 or T2, but because the equations of formulae (3) and (6) are approximate formulae, the precision of the estimated T1 and T2 is not high enough.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

Figure 1:
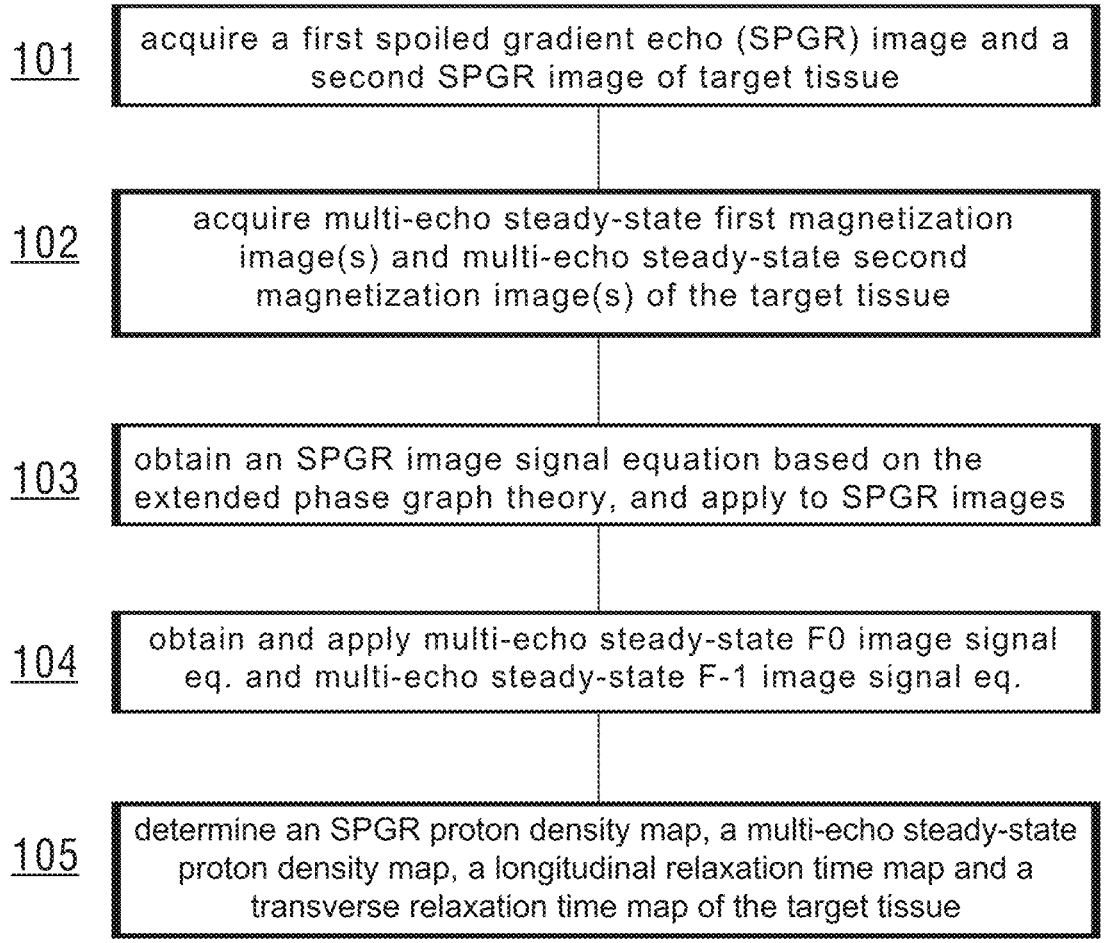
FIG. 1 is a flow chart of a method for quantitative detection of parameters in MRI according to an exemplary embodiment of the present disclosure.

The exemplary embodiments of the present disclosure will be described with reference to the accompanying drawings. Elements, features and components that are identical, functionally identical and have the same effect are—insofar as is not stated otherwise—respectively provided with the same reference character.

DETAILED DESCRIPTION

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure. The connections shown in the figures between functional units or other elements can also be implemented as indirect connections, wherein a connection can be wireless or wired. Functional units can be implemented as hardware, software or a combination of hardware and software.

In view of the above, an object of the present disclosure is to provide a method and apparatus for quantitative detection of parameters in MRI, to increase the precision of quantitative detection of parameters in MRI.

In an exemplary embodiment, a method for quantitative detection of parameters in MRI, the method may include: acquiring a first spoiled gradient echo image and a second spoiled gradient echo image of target tissue, wherein the first spoiled gradient echo image and second spoiled gradient echo image are obtained by using a spoiled gradient echo sequence with a first flip angle and a second flip angle respectively to scan the target tissue, the first flip angle and second flip angle being different; acquiring at least one multi-echo steady-state first magnetization image and at least one multi-echo steady-state second magnetization image of the target tissue, wherein the multi-echo steady-state first magnetization image and the multi-echo steady-state second magnetization image are obtained by using a multi-echo steady-state sequence to scan the target tissue, the multi-echo steady-state first magnetization image is used to describe a magnetization signal formed just after excitation, and the multi-echo steady-state second magnetization image is used to describe a magnetization signal refocused just before excitation; obtaining a spoiled gradient echo image signal equation based on the extended phase graph theory, and applying this equation to the first spoiled gradient echo image and the second spoiled gradient echo image; establishing a multi-echo steady-state first magnetization image signal equation and a multi-echo steady-state second magnetization image signal equation based on the extended phase graph theory, applying the multi-echo steady-state first magnetization image signal equation to the at least one multi-echo steady-state first magnetization image, and applying the multi-echo steady-state second magnetization image signal equation to the at least one multi-echo steady-state second magnetization image; and obtaining a spoiled gradient echo proton density map, a multi-echo steady-state proton density map, a longitudinal relaxation time map and a transverse relaxation time map of the target tissue by solving, based on a signal equation of the first spoiled gradient echo image, a signal equation of the second spoiled gradient echo image, a signal equation of the at least one multi-echo steady-state first magnetization image and a signal equation of the at least one multi-echo steady-state second magnetization image.

In an exemplary embodiment, the signal equation of the spoiled gradient echo image is: an equality relation between a spoiled gradient echo signal value of each voxel of the target tissue on the spoiled gradient echo image and the following 8 parameters: the spoiled gradient echo proton density of each voxel of the target tissue, the longitudinal relaxation time of each voxel, the transverse relaxation time of each voxel, the repetition time corresponding to the spoiled gradient echo image, the flip angle of each voxel for the spoiled gradient echo image, the RF spoiled RF pulse phase difference increment, the echo time corresponding to the spoiled gradient echo image and the transverse relaxation time of each voxel caused by magnetic field inhomogeneity.

In an exemplary embodiment, the signal equation of the spoiled gradient echo image is:

$$S_{SPGR,l}(v) = M_{0,SPGR}(v) \cdot$$
$$f_{EPG}(T1(v), T2(v), TR_{SPGR,l}, \alpha_{SPGR,l}(v), \Psi) \cdot \exp\left(-\frac{TE_{SPGR,l}}{T2(v)} - \frac{TE_{SPGR,l}}{T2'(v)}\right)$$

where v is the sequence number of a voxel on the target tissue; l is the sequence number of the spoiled gradient echo image, such that when l=1, this corresponds to the first spoiled gradient echo image, and when l=2, this corresponds to the second spoiled gradient echo image; $S_{SPGR,l}(v)$ is the signal value of the voxel v on the spoiled gradient echo image l, $M_{0,SPGR}(v)$ is the spoiled gradient echo proton density of the voxel v, $f_{EPG}$ ( ) is a predefined steady-state first magnetization function, T1(v) is the longitudinal relaxation time of the voxel v, T2(v) is the transverse relaxation time of the voxel v, $TR_{SPGR,l}$ is the repetition time corresponding to the spoiled gradient echo image l, $\alpha_{SPGR,l}(v)$ is the flip angle of the voxel v for the spoiled gradient echo image l, $\Psi$ is the RF spoiled RF pulse phase difference increment, $TE_{SPGR,l}$ is the echo time corresponding to the spoiled gradient echo image l, and T2'(v) is the transverse relaxation time of the voxel v caused by magnetic field inhomogeneity.

In an exemplary embodiment, the signal equation of the multi-echo steady-state first magnetization image is: an equality relation between a first magnetization signal value of each voxel of the target tissue on the multi-echo steady-state first magnetization image and the following 7 parameters: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state first magnetization image and the transverse relaxation time of each voxel caused by magnetic field inhomogeneity.

In an exemplary embodiment, the signal equation of the multi-echo steady-state second magnetization image is: an equality relation between a second magnetization signal value of each voxel of the target tissue on the multi-echo steady-state second magnetization image and the following: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state second magnetization image and the transverse relaxation time of each voxel caused by magnetic field inhomogeneity.

In an exemplary embodiment, the signal equation of the multi-echo steady-state first magnetization image is:

$$F_{0,n}(v) = M_{0,DESS}(v) \cdot \tan\left(\frac{\alpha_{DESS}(v)}{2}\right) \cdot$$
$$(1 - (E1(v) - \cos \alpha_{DESS}(v)) \cdot r(v)) \cdot \exp\left(-\frac{TE_{0,n}}{T2(v)} - \frac{TE_{0,n}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = \left(1 - E2^2(v)\right) \cdot \left(p^2(v) - q^2(v)\right)^{\frac{-1}{2}}$$

where n is the sequence number, in a multi-echo steady-state sequence, of the echo time corresponding to the current multi-echo steady-state first magnetization image, v is the sequence number of a voxel on the target tissue, $F_{0,n}(v)$ is the signal value of the voxel v on the current multi-echo steady-state first magnetization image, $M_{0,DESS}(v)$ is the multi-echo steady-state proton density of the voxel v, $\alpha_{DESS}(v)$ is the multi-echo steady-state flip angle of the voxel v, $TE_{0,n}$ is the echo time of the voxel v for the current multi-echo steady-state first magnetization image, $TR_{DESS}$ is the repetition time corresponding to the multi-echo steady-state image, T1(v) is the longitudinal relaxation time of the voxel v, T2(v) is the transverse relaxation time of the voxel v, and T2' (v) is the transverse relaxation time of the voxel v caused by magnetic field inhomogeneity.

In an exemplary embodiment, the signal equation of the multi-echo steady-state second magnetization image is:

$$F_{-1,m}(v) = M_{0,DESS}(v) \cdot \tan\left(\frac{\alpha_{DESS}(v)}{2}\right) \cdot$$
$$\frac{1 - (1 - E1(v) \cdot \cos \alpha_{DESS}(v)) \cdot r(v)}{E2(v)} \cdot \exp\left(-\frac{TR_{DESS} - TE_{-1,m}}{T2(v)} - \frac{TE_{-1,m}}{T2'(v)}\right)$$

where:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = \left(1 - E2^2(v)\right) \cdot \left(p^2(v) - q^2(v)\right)^{\frac{-1}{2}}$$

where m is the sequence number, in a multi-echo steady-state sequence, of the echo time corresponding to the current multi-echo steady-state second magnetization image, v is the sequence number of a voxel on the target tissue, $F_{-1,n}(v)$ is the signal value of the voxel v on the current multi-echo steady-state second magnetization image, $M_{0,DESS}(v)$ is the multi-echo steady-state proton density of the voxel v, $\alpha_{DESS}(v)$ is the multi-echo steady-state flip angle of the voxel v, $TE_{-1,m}$ is the echo time of the voxel v for the current multi-echo steady-state second magnetization image, $TR_{DESS}$ is the repetition time corresponding to the multi-echo steady-state image, $T1(v)$ is the longitudinal relaxation time of the voxel v, $T2(v)$ is the transverse relaxation time of the voxel v, and $T2'(v)$ is the transverse relaxation time of the voxel v caused by magnetic field inhomogeneity.

In an exemplary embodiment, after the step of obtaining the spoiled gradient echo proton density map, multi-echo steady-state proton density map, longitudinal relaxation time map and transverse relaxation time map of the target tissue by solving, the method may further include:

obtaining a magnetization transfer weighted map of the target tissue by computation, based on the spoiled gradient echo proton density map and multi-echo steady-state proton density map of the target tissue, by means of the following equality:

$$MTR(v) = (M_{0,SPGR}(v) - C \cdot M_{0,DESS}(v))/M_{0,SPGR}(v),$$

where v is the sequence number of a voxel on the target tissue, $MTR(v)$ is the magnetization transfer weight value of the voxel v, $M_{0,SPGR}(v)$ is the spoiled gradient echo proton density of the voxel v, $M_{0,DESS}(v)$ is the multi-echo steady-state proton density of the voxel v, and C is a preset constant.

The step of obtaining the spoiled gradient echo proton density map, multi-echo steady-state proton density map, longitudinal relaxation time map and transverse relaxation time map of the target tissue by solving may further include obtaining a map of the transverse relaxation time T2' of the target tissue caused by magnetic field inhomogeneity by solving.

In an exemplary embodiment, after the step of obtaining the T2' map of the target tissue by solving, the method may further include, based on the transverse relaxation time map and the T2' map of the target tissue, and by means of the following equality:

$$\frac{1}{T2*(v)} = \frac{1}{T2(v)} + \frac{1}{T2'(v)}$$

obtaining an effective transverse relaxation time T2* map of the target tissue by computation, where v is the sequence number of a voxel on the target tissue, $T2*(v)$ is the effective transverse relaxation time of the voxel v, $T2(v)$ is the transverse relaxation time of the voxel v, and $T2'(v)$ is the transverse relaxation time of the voxel v caused by magnetic field inhomogeneity.

In an exemplary embodiment, simultaneously with the step of acquiring a first spoiled gradient echo image of target tissue, the method may further include: acquiring a receiving RF field B1 map of the target tissue, and computing a flip angle of each voxel for the first spoiled gradient echo image according to the B1 map. In an exemplary embodiment, simultaneously with the step of acquiring a second spoiled gradient echo image of the target tissue, the method may further include computing a flip angle of each voxel for the second spoiled gradient echo image according to the B1 map. In an exemplary embodiment, simultaneously with the step of acquiring at least one multi-echo steady-state first magnetization image and at least one multi-echo steady-state second magnetization image of the target tissue, the method may further include computing a multi-echo steady-state flip angle of each voxel according to the B1 map.

In an exemplary embodiment, an apparatus for quantitative detection of parameters in MRI may include:
  a spoiled gradient echo image acquisition module, for acquiring a first spoiled gradient echo image and a second spoiled gradient echo image of target tissue, wherein the first spoiled gradient echo image and second spoiled gradient echo image are obtained by using a spoiled gradient echo sequence with a first flip angle and a second flip angle respectively to scan the target tissue, the first flip angle and second flip angle being different;
  a multi-echo steady-state image acquisition module, for acquiring at least one multi-echo steady-state first magnetization image and at least one multi-echo steady-state second magnetization image of the target tissue, wherein the multi-echo steady-state first magnetization image and the multi-echo steady-state second magnetization image are obtained by using a multi-echo steady-state sequence to scan the target tissue, the multi-echo steady-state first magnetization image is used to describe a magnetization signal formed just after excitation, and the multi-echo steady-state second magnetization image is used to describe a magnetization signal refocused just before excitation;
  a spoiled gradient echo image signal equation establishing and applying module, for obtaining a spoiled gradient echo image signal equation based on the extended phase graph theory, and applying this equation to the first spoiled gradient echo image and the second spoiled gradient echo image;
  a multi-echo steady-state image signal equation establishing and applying module, for establishing a multi-echo steady-state first magnetization image signal equation and a multi-echo steady-state second magnetization image signal equation based on the extended phase graph theory, applying the multi-echo steady-state first magnetization image signal equation to the at least one multi-echo steady-state first magnetization image, and applying the multi-echo steady-state second magnetization image signal equation to the at least one multi-echo steady-state second magnetization image; and
  a computing module, for obtaining a spoiled gradient echo proton density map, a multi-echo steady-state proton density map, a longitudinal relaxation time map and a transverse relaxation time map of the target tissue by solving, based on a signal equation of the first spoiled gradient echo image, a signal equation of the second spoiled gradient echo image, a signal equation of the at least one multi-echo steady-state first magnetization image and a signal equation of the at least one multi-echo steady-state second magnetization image.

In an exemplary embodiment, a magnetic resonance scanner may include the apparatus for quantitative detection of parameters in MRI according to the present disclosure.

In one or more exemplary embodiments of the present disclosure, after using a spoiled gradient echo sequence and a multi-echo steady-state sequence to perform a scan, and establishing signal equations for a spoiled gradient echo image, a multi-echo steady-state first magnetization image and a multi-echo steady-state second magnetization image based on the extended phase graph theory, the spoiled gradient echo image equation is applied to the first spoiled gradient echo image and the second spoiled gradient echo image, the multi-echo steady-state first magnetization image signal equation is applied to the at least one multi-echo steady-state first magnetization image, and the multi-echo steady-state second magnetization image signal equation is applied to the at least one multi-echo steady-state second magnetization image, and solving is then performed to obtain a spoiled gradient echo proton density map, a multi-echo steady-state proton density map, a longitudinal relaxation time map and a transverse relaxation time map of the target tissue. The extended phase graph theory is obtained on the basis of the Bloch equations, plus the effects of large molecule magnetization transfer and other effects are felt, and differences in the spoiled gradient echo proton density map and the multi-echo steady-state proton density map are taken into account in a parameter estimation model; therefore, the longitudinal relaxation time map and transverse relaxation time map obtained by solving have high precision.

FIG. 1 is a flow chart of a method for quantitative detection of parameters in MRI as provided in an exemplary embodiment of the present disclosure, specifically comprising the following steps:

Step 101: acquiring a first SPGR (spoiled gradient echo) image and a second SPGR image of target tissue, wherein the first SPGR image and second SPGR image are obtained by using an SPGR sequence with a first flip angle and a second flip angle respectively to scan the target tissue, the first flip angle and second flip angle being different.

Step 102: acquiring at least one multi-echo steady-state first magnetization image (i.e. a multi-echo steady-state $F_0$ image) and at least one multi-echo steady-state second magnetization image (i.e. a multi-echo steady-state $F_{-1}$ image) of the target tissue, wherein the multi-echo steady-state $F_0$ image and the multi-echo steady-state $F_{-1}$ image are obtained by using a multi-echo sequence (such as a multi-echo DESS sequence or multi-echo TESS sequence) to scan the target tissue, the multi-echo steady-state $F_0$ image is used to describe a magnetization signal formed just after excitation, and the multi-echo steady-state $F_{-1}$ image is used to describe magnetization refocused just before excitation.

The multi-echo steady-state $F_0$ image is for example a DESS $F_0$ image or a TESS (triple echo steady state) $F_0$ image, etc.; the multi-echo steady-state $F_{-1}$ image is for example a DESS $F_{-1}$ image or a TESS $F_{-1}$ image, etc.

Step 103: based on the extended phase graph theory, an SPGR image signal equation is obtained, and applied to the first SPGR image and the second SPGR image.

The SPGR image signal equation describes an equality relation between an SPGR signal value of each voxel of target tissue on the SPGR image and the following 8 parameters: the SPGR proton density of each voxel of target tissue, the longitudinal relaxation time of each voxel, the transverse relaxation time of each voxel, the repetition time corresponding to the SPGR image, the flip angle of each voxel for the SPGR image, the RF spoiled RF pulse phase difference increment, the echo time corresponding to the SPGR image and the transverse relaxation time of each voxel caused by magnetic field inhomogeneity.

Step 104: based on the extended phase graph theory, a multi-echo steady-state $F_0$ image signal equation and a multi-echo steady-state $F_{-1}$ image signal equation are established; the multi-echo steady-state $F_0$ image signal equation is applied to the at least one multi-echo steady-state $F_0$ image, and the multi-echo steady-state $F_{-1}$ image signal equation is applied to the at least one multi-echo steady-state $F_{-1}$ image.

The multi-echo steady-state $F_0$ image signal equation describes an equality relation between a first magnetization signal (i.e. $F_0$ signal) value of each voxel of target tissue on the multi-echo steady-state $F_0$ image and the following 7 parameters: the multi-echo steady-state proton density of each voxel of target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state $F_0$ image and the transverse relaxation time of each voxel caused by magnetic field inhomogeneity. The multi-echo steady-state $F_{-1}$ image signal equation describes an equality relation between a second magnetization signal (i.e. $F_{-1}$ signal) value of each voxel of target tissue on the multi-echo steady-state $F_{-1}$ image and the following: the multi-echo steady-state proton density of each voxel of target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state $F_{-1}$ image and the transverse relaxation time of each voxel caused by magnetic field inhomogeneity.

Step 105: based on the signal equation of the first SPGR image, the signal equation of the second SPGR image, the signal equation of the at least one multi-echo steady-state $F_0$ image and the signal equation of the at least one multi-echo steady-state $F_{-1}$ image, the following are obtained by solving: an SPGR proton density map, a multi-echo steady-state proton density map, a longitudinal relaxation time map and a transverse relaxation time map of the target tissue.

The embodiment described above has the following beneficial technical effects: after using an SPGR sequence and a multi-echo steady-state sequence to perform a scan, and establishing signal equations for an SPGR image, a multi-echo steady-state $F_0$ image and a multi-echo steady-state $F_{-1}$ image based on the extended phase graph theory, the SPGR image equation is applied to the first SPGR image and the second SPGR image, the multi-echo steady-state $F_0$ image signal equation is applied to the at least one multi-echo steady-state $F_0$ image, and the multi-echo steady-state $F_{-1}$ image signal equation is applied to the at least one multi-echo steady-state $F_{-1}$ image, and solving is then performed to obtain an SPGR proton density map, a multi-echo steady-state proton density map, a T1 map and a T2 map of the target tissue. The extended phase graph theory is obtained on the basis of the Bloch equations, plus the effects of large molecule magnetization transfer and other effects are felt, and differences in the SPGR proton density map and the multi-echo steady-state proton density map are taken into account in a parameter estimation model; therefore, the transverse relaxation time map and longitudinal relaxation time map obtained by solving have high precision.

In an exemplary embodiment, the SPGR image signal equation is:

$$S_{SPGR,l}(v) = M_{0,SPGR}(v) \cdot \qquad (7)$$
$$f_{EPG}(T1(v), T2(v), TR_{SPGR,l}, \alpha_{SPGR,l}(v), \Psi) \cdot \exp\left(-\frac{TE_{SPGR,l}}{T2(v)} - \frac{TE_{SPGR,l}}{T2'(v)}\right)$$

where v is the sequence number of a voxel on the target tissue; l is the sequence number of the SPGR image, such that when l=1, this corresponds to the first SPGR image, and when l=2, this corresponds to the second SPGR image; $S_{SPGR,l}(v)$ is the signal value of the voxel v on the SPGR image l, $M_{0,SPGR}(v)$ is the SPGR proton density of the voxel v, $f_{EPG}(\ )$ is a predefined steady-state first magnetization function (i.e. $F_0$ function), T1(v) is the longitudinal relaxation time of the voxel v, T2(v) is the transverse relaxation time of the voxel v, $TR_{SPGR,l}$ is the repetition time corresponding to the SPGR image l, $\alpha_{SPGR,l}(v)$ is the flip angle of the voxel v for the SPGR image l, $\Psi$ is the RF spoiled RF pulse phase difference increment, $TE_{SPGR,l}$ is the echo time corresponding to the SPGR image l, and T2'(v) is the transverse relaxation time of the voxel v caused by magnetic field inhomogeneity.

In an exemplary embodiment, the multi-echo steady-state $F_0$ image signal equation is:

$$F_{0,n}(v) = M_{0,DESS}(v) \cdot \tan\left(\frac{\alpha_{DESS}(v)}{2}\right) \cdot \qquad (8)$$

$$(1 - (E1(v) - \cos\alpha_{DESS}(v)) \cdot r(v)) \cdot \exp\left(-\frac{TE_{0,n}}{T2(v)} - \frac{TE_{0,n}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos\alpha_{DESS}(v) - E2^2(v) \cdot (E1(v) - \cos\alpha_{DESS}(v))$$

$$q(v) = E2(v) \cdot (1 - E1(v)) \cdot (1 + \cos\alpha_{DESS}(v))$$

$$r(v) = (1 - E2^2(v)) \cdot (p^2(v) - q^2(v))^{\frac{-1}{2}},$$

where n is the sequence number, in a multi-echo steady-state sequence, of the echo time corresponding to the current multi-echo steady-state $F_0$ image, v is the sequence number of a voxel on the target tissue, $F_{0,n}(v)$ is the signal value of the voxel v on the current multi-echo steady-state $F_0$ image, $M_{0,DESS}(v)$ is the multi-echo steady-state proton density of the voxel v, $\alpha_{DESS}(v)$ is the multi-echo steady-state flip angle of the voxel v, $TE_{0,n}$ is the echo time of the voxel v for the current multi-echo steady-state $F_0$ image, $TR_{DESS}$ is the repetition time corresponding to the multi-echo steady-state image, T1(v) is the longitudinal relaxation time of the voxel v, T2(v) is the transverse relaxation time of the voxel v, and T2'(v) is the transverse relaxation time of the voxel v caused by magnetic field inhomogeneity.

In an exemplary embodiment, the multi-echo steady-state $F_{-1}$ image signal equation is:

$$F_{-1,m}(v) = M_{0,DESS}(v) \cdot \tan\left(\frac{\alpha_{DESS}(v)}{2}\right) \cdot \qquad (9)$$

$$\frac{1 - (1 - E1(v) \cdot \cos\alpha_{DESS}(v))r(v)}{E2(v)} \cdot \exp\left(-\frac{TR_{DESS} - TE_{-1,m}}{T2(v)} - \frac{TE_{-1,m}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos\alpha_{DESS}(v) - E2^2(v) \cdot (E1(v) - \cos\alpha_{DESS}(v))$$

$$q(v) = E2(v) \cdot (1 - E1(v)) \cdot (1 + \cos\alpha_{DESS}(v))$$

$$r(v) = (1 - E2^2(v)) \cdot (p^2(v) - q^2(v))^{\frac{-1}{2}}$$

where m is the sequence number, in a multi-echo steady-state sequence, of the echo time corresponding to the current multi-echo steady-state $F_{-1}$ image, v is the sequence number of a voxel on the target tissue, $F_{-1,n}(v)$ is the signal value of the voxel v on the current multi-echo steady-state $F_{-1}$ image, $M_{0,DESS}(v)$ is the multi-echo steady-state proton density of the voxel v, $\alpha_{DESS}(v)$ is the multi-echo steady-state flip angle of the voxel v, $TE_{-1,m}$ is the echo time of the voxel v for the current multi-echo steady-state $F_{-1}$ image, $TR_{DESS}$ is the repetition time corresponding to the multi-echo steady-state image, T1(v) is the longitudinal relaxation time of the voxel v, T2(v) is the transverse relaxation time of the voxel v, and T2'(v) is the transverse relaxation time of the voxel v caused by magnetic field inhomogeneity.

In real applications, the echo time $TE_{SPGR,1}$ corresponding to the first SPGR image, the echo time $TE_{SPGR,2}$ corresponding to the second SPGR image, the echo time $TE_{0,1}$ corresponding to the multi-echo steady-state $F_{0,1}$ image (the $F_0$ image acquired at the first echo time) and the echo time $TE_{-1,1}$ corresponding to the multi-echo steady-state $F_{-1,1}$ image (the $F_{-1}$ image acquired at the first echo time) are set to be equal, i.e. $TE_{SPGR,1}=TE_{SPGR,2}=TE_{0,1}=TE_{-1,1}$; then the first SPGR image and the second SPGR image are separately applied to formula (7), the multi-echo steady-state $F_{0,1}$ image is applied to formula (8), and the multi-echo steady-state $F_{-1,1}$ image is applied to formula (9), to obtain four signal equations, which have the same term:

$$\exp\left(-\frac{TE_{SPGR,1}}{T2'(v)}\right).$$

Since the values of $M_{0,SPGR}(v)$ and $M_{0,DESS}(v)$ are relative values, we can let this same term $$\exp\left(-\frac{TE_{SPGR,1}}{T2'(v)}\right)$$

be equal to a constant; most simply, we let $$\exp\left(-\frac{TE_{SPGR,1}}{T2'(v)}\right) = 1.$$

The four signal equations then have only four unknowns: $M_{0,SPGR}(v)$, $M_{0,DESS}(v)$, T1(v) and T2(v) (wherein $\alpha_{SPGR,l}(v)$ is expressed as the nominal flip angle of the corresponding SPGR sequence, and $\alpha_{DESS}(v)$ is expressed as the nominal flip angle of the corresponding multi-echo steady-state sequence). The four signal equations can be solved to obtain the four unknowns: the values of $M_{0,SPGR}(v)$, $M_{0,DESS}(v)$, T1(v) and T2(v). Alternatively, an iterative method is used: utilizing the insensitivity of the SPGR images to T2 and the insensitivity of the multi-echo steady-state images to T1, the signal equations corresponding to the first SPGR image and the second SPGR image are used to solve for T1(v), this T1(v) is substituted into the two signal equations corresponding to the multi-echo steady-state $F_{0,1}$ image and the multi-echo steady-state $F_{-1,1}$ image to solve for T2(v), then this T2(v) is substituted into the signal equations corresponding to the first SPGR image and the second SPGR image to solve for a new T1(v), this new T1(v) is again substituted into the two signal equations corresponding to the multi-echo steady-state $F_{0,1}$ image and the multi-echo steady-state $F_{-1,1}$ image to solve for a new T2(v), and this process is repeated until $M_{0,SPGR}(v)$, $M_{0,DESS}(v)$, T1(v) and T2(v) converge (i.e. $M_{0,SPGR}(v)$, $M_{0,DESS}(v)$, T1(v) and T2(v) no longer change). When the values of $M_{0,SPGR}(v)$, $M_{0,DESS}(v)$, T1(v) and T2(v) of all voxels on the target tissue have been obtained, the SPGR proton density map, multi-echo steady-state proton density map, T1 map and T2 map of the target tissue have been obtained.

In an exemplary embodiment, in step 105, after obtaining the SPGR proton density map, multi-echo steady-state proton density map, T1 map and T2 map of the target tissue by solving, the method further comprises:

based on the SPGR proton density map and multi-echo steady-state proton density map of the target tissue, and by means of the following equality:

$$MTR(v) = (M_{0,SPGR}(v) - C \cdot M_{0,DESS}(v))/M_{0,SPGR}(v) \quad (10)$$

an MT weighted map of the target tissue is obtained by computation, where v is the sequence number of a voxel on the target tissue, MTR(v) is the MT weight value of the voxel v, $M_{0,SPGR}(v)$ is the SPGR proton density of the voxel v, $M_{0,DESS}(v)$ is the multi-echo steady-state proton density of the voxel v; and C is a preset constant, used to adjust other effects that cause a difference between $M_{0,SPGR}(v)$ and $M_{0,DESS}(v)$.

In an exemplary embodiment, in step 105, the step of obtaining the SPGR proton density map, multi-echo steady-state proton density map, T1 map and T2 map of the target tissue by solving further comprises: solving to obtain a T2' (transverse relaxation time caused by magnetic field inhomogeneity) map of the target tissue.

In actual applications, because the multi-echo steady-state sequence is itself a multi-echo sequence, multiple multi-echo steady-state $F_0$ images and multiple multi-echo steady-state $F_{-1}$ images can be acquired, then two multi-echo steady-state $F_0$ images can be chosen from these and applied to formula (8) to obtain two signal equations, to which are added: two signal equations obtained by separately applying the first SPGR image and second SPGR image to formula (7), and one signal equation obtained by applying the multi-echo steady-state $F_{-1,1}$ image to formula (9), thus obtaining 5 signal equations in total, at which time there are a total of 5 unknowns: $M_{0,SPGR}(v)$, $M_{0,DESS}(v)$, T1(v), T2(v) and T2'(v). The 5 signal equations are solved to obtain the values of the 5 unknowns: $M_{0,SPGR}(v)$, $M_{0,DESS}(v)$, T1(v), T2(v) and T2'(v). When the values of $M_{0,SPGR}(v)$, $M_{0,DESS}(v)$, T1(v), T2(v) and T2'(v) of all voxels on the target tissue have been obtained, the SPGR proton density map, multi-echo steady-state proton density map, T1 map, T2 map and T2' map of the target tissue have been obtained.

Furthermore, when multiple echoes are acquired in the multi-echo steady-state imaging process, it is not only possible to increase the signal-to-noise ratio in quantitative detection of parameters, but also possible to simultaneously obtain a B0 (transmitting RF field) map and an effective transverse relaxation time (T2*) map, wherein the B0 map can be obtained by computation directly from a phase diagram, and the T2* map is obtained in the following way:

In an exemplary embodiment, in step 105, after obtaining the T2' map of the target tissue by solving, the method further comprises: based on the T2 map and the T2' map of the target tissue, and by means of the following equality:

$$\frac{1}{T2^*(v)} = \frac{1}{T2(v)} + \frac{1}{T2'(v)} \quad (11)$$

obtaining a T2* map of the target tissue by computation, where v is the sequence number of a voxel on the target tissue, T2* (v) is T2* of the voxel v, T2(v) is T2 of the voxel v, and T2' (v) is T2' of the voxel v.

In an exemplary embodiment, in step 101, at the same time as acquiring the first SPGR image of the target tissue, the method further comprises: acquiring a B1 (receiving RF field) map of the target tissue, and obtaining a flip angle $\alpha_{SPGR,1}(v)$ of each voxel for the first SPGR image by computation according to the B1 map, and applying the $\alpha_{SPGR,1}(v)$ to the signal equation (7) of the first SPGR image;

in step 101, at the same time as acquiring the second SPGR image of the target tissue, the method further comprises: obtaining a flip angle $\alpha_{SPGR,2}(v)$ of each voxel for the second SPGR image by computation according to the B1 map, and applying the $\alpha_{SPGR,2}(v)$ to the signal equation (7) of the second SPGR image;

in step 102, at the same time as acquiring at least one multi-echo steady-state $F_0$ image and at least one multi-echo steady-state $F_{-1}$ image of the target tissue, the method further comprises: obtaining a multi-echo steady-state flip angle $\alpha_{DESS}(v)$ of each voxel by computation according to the B1 map, and applying this $\alpha_{DESS}(v)$ to the signal equation (8) of the at least one multi-echo steady-state $F_0$ image and the signal equation (9) of the at least one multi-echo steady-state $F_{-1}$ image.

In the embodiment above, the flip angle of each voxel is acquired by means of the B1 map, and applied in the signal equation of the corresponding image, thus further increasing the precision of the detected parameters.

In addition, in the embodiments of the present disclosure, at the same time as obtaining the SPGR proton density map, the multi-echo steady-state proton density map, the T1 map, the T2 map and the T2' map of the target tissue, the B0 map and MT weighted map of the target tissue may be obtained by measurement.

The embodiments of the present disclosure may also replace the SPGR sequence with a multi-echo SPGR sequence, to acquire three or more SPGR images, to obtain more information, and thereby obtain higher image quality, and thus increase the precision of each parameter that is ultimately obtained.

The method provided in the embodiments of the present disclosure may be applied in the diagnosis of muscular dystrophy, inflammation, fibrosis or/and cartilage integrity, etc.

The embodiments of the present disclosure have the following beneficial technical effects:

1. Two SPGR acquisitions are performed at two different flip angles, and one multi-echo steady-state acquisition is performed, to simultaneously perform T1 and T2 detection, and moreover, the signal equations used are based on an extended phase graph derived from the Bloch equations, without using any approximation, so the precision of quantitative detection is greatly increased.

2. Different proton densities $M_{0,SPGR}$ and $M_{0,DESS}$ computed for the SPGR sequence and multi-echo steady-state sequence are detected, to display the magnetization transfer effect which arises due to their flip angles and sequence differences; the difference between $M_{0,SPGR}$ and $M_{0,DESS}$ may be used to compute an MT weighted map which enhances large-molecule contrast.

3. Because $M_{0,SPGR}$ and $M_{0,DESS}$ are relative values, the effect of T2' can be separated from each signal equation, thereby increasing the accuracy of T2 measurement; and because the multi-echo steady-state sequence is a multi-echo sequence, multiple multi-echo steady-state images can be acquired on multiple echoes, and it is thus possible to estimate T2' without the need for additional acquisition.

4. At the same time as $M_{0,SPGR}$, $M_{0,DESS}$, T1, T2 and T2' are measured, it is possible to obtain T2* and B0 maps, a PD weighted map and an MT weighted map by measurement.
Application Examples of the Present Disclosure are Given Below:

The experiment subject here is a healthy volunteer, and all experiments are carried out on a 3 T MR scanner.
The Experimental Process is as Follows:

SPGR sequences with two different flip angles are used separately to scan the healthy volunteer's knee, to obtain an SPGR image 1 and an SPGR image 2. The SPGR sequence imaging parameters are: TE=3 ms (milliseconds), TR=10 ms, the two flip angles are 4° and 21°, the FOV (field of view)=160 mm×160 mm×56 mm, and the imaging matrix=256×256×28.

A DESS sequence is used to scan the healthy volunteer's knee, to obtain a DESS $F_{0,0}$ image and a DESS $F_{-1,0}$ image. The imaging parameters of the DESS sequence are: TE=3 ms, TR=20 ms, flip angle=40°, FOV=160 mm×160 mm×56 mm, imaging matrix=256×256×28.

Figure 2:
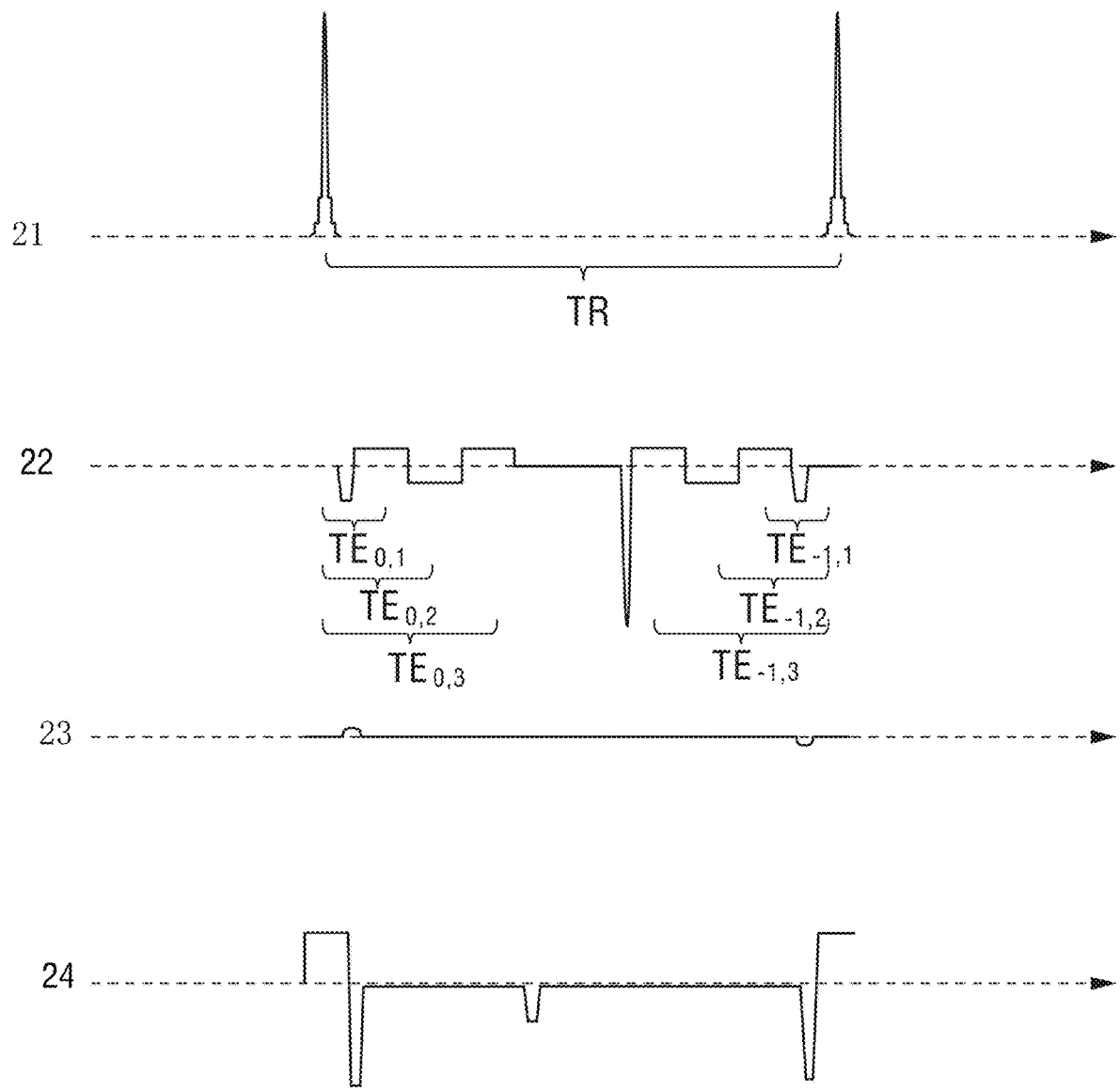
FIG. 2 is a schematic drawing of an example DESS sequence.

FIG. 2 is a schematic drawing of the DESS sequence used in this application example. 21 is the RF pulses, 22 is the readout gradient strength, 23 is the phase encoding gradient strength, and 24 is the partition encoding gradient strength.

Furthermore, for the two SPGR sequence scans with different flip angles and the DESS sequence scan, the same protocol mentioned above is used, and presaturation spin fast low-angle excitation (FOV=200 mm×200 mm×87.5 mm, imaging matrix=64×64×28) is used to acquire a corresponding B1 map. The B1 map is used to acquire the flip angle of each voxel.

In this experiment, a water model composed of four tubes is established to compare the method provided in the embodiments of the present disclosure with existing methods. The agarose contents corresponding to each tube are 2.27%, 2.86%, 3.43% and 4% respectively, and the copper sulfate contents are all 0.003 M.

Existing method 4 is used to estimate the T1 values of the four tubes based on SPGR image 1 and SPGR image 2, then existing method 4 is used to estimate the T2 values of the four tubes based on the DESS $F_{0,0}$ image and the DESS $F_{-1,0}$ image.

The method provided in the embodiments of the present disclosure is used to compute the T1 values and T2 values of the four tubes based on SPGR image 1, SPGR image 2, the DESS $F_{0,0}$ image and the DESS $F_{-1,0}$ image. The TEs corresponding to SPGR image 1, SPGR image 2, the DESS $F_{0,0}$ image and the DESS $F_{-1,0}$ image are the same.

An IR spin echo sequence is used to scan the water model, with the imaging parameters: IR=200/400/600/800/1000/1200/1400/1600/1800/2000 ms, TE=10 ms, TR=20000 ms; existing method 1 is used to estimate the T1 values of the four tubes;

a one-dimensional spin echo sequence is used to scan the water model, with the imaging parameters: TE=10/30/50/70/90/110/130/150 ms, TR=20000 ms; existing method 2 is used to estimate the T2 values of the four tubes;

a MESE sequence is used to scan the water model, with the imaging parameters: TE=13.8/27.6/41.4/55.2/69 ms, TR=1980 ms, FOV=128 mm×128 mm×56 mm, imaging matrix=128×128×28; existing method 2 is used to estimate the T2 values of the four tubes.

Figure 3:
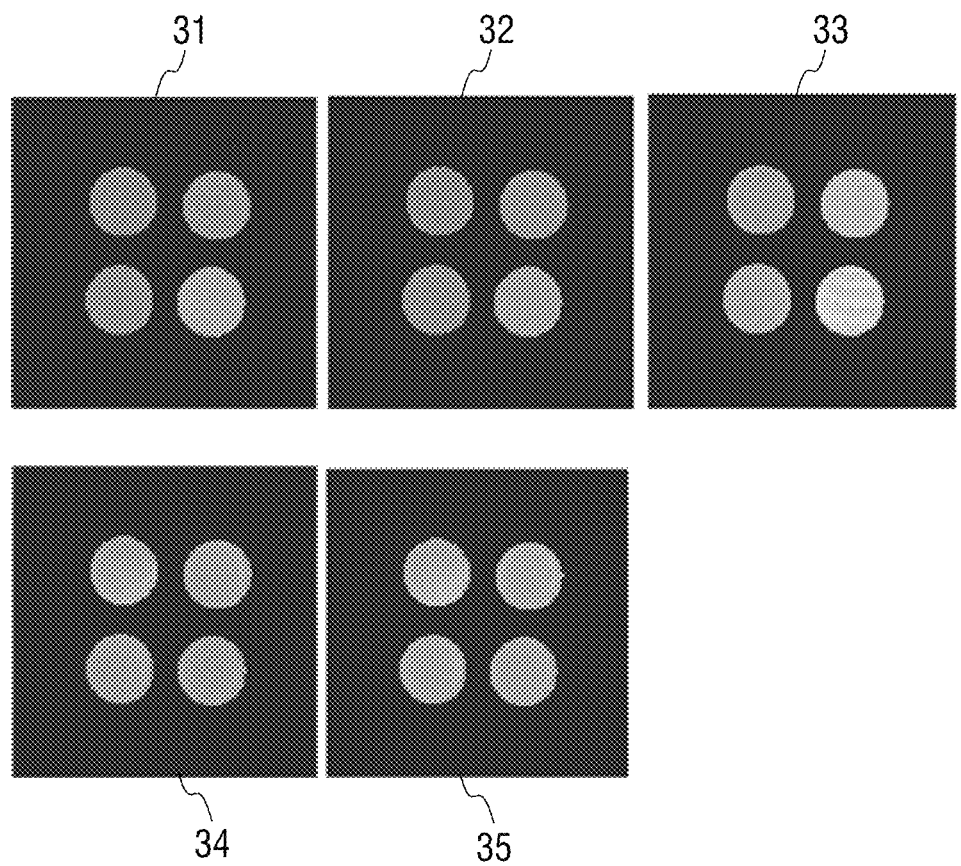
FIG. 3 is a plot of experimental results of T1/T2 maps obtained using the conventional methods and using the method according to exemplary embodiments of the present disclosure.

The method provided in the embodiments of the present disclosure is compared with existing method 1 and existing method 2;

FIG. 3 shows the experimental results of T1/T2 maps obtained using the existing methods and the method provided in the embodiments of the present disclosure, wherein 31 is the experimental result of the T1 map obtained using the method provided in the embodiments of the present disclosure, 32 is the experimental result of the T2 map obtained using existing method 4, 33 is the experimental result of the T2 map obtained using the MESE sequence of existing method 2, 34 is the experimental result of the T1 map obtained using the method provided in the embodiments of the present disclosure, and 35 is the experimental result of the T1 map obtained using existing method 4. It can be seen that:

The T2 values obtained using the method provided in the embodiments of the present disclosure are slightly lower than the T2 values obtained using the MESE sequence of existing method 2. Visually, the T1 and T2 maps obtained using the method provided in the embodiments of the present disclosure are similar to T1 maps and T2 maps respectively obtained using the existing SPGR and DESS methods respectively.

Table 1 shows the mean T1 and T2 values obtained by the different methods:

TABLE 1

|  | T2 mean value obtained by the gold standard mapping method of existing method 2 | T2 mean value obtained by the method provided in the embodiments of the present disclosure | T2 mean value obtained by existing method 4 | T2 mean value obtained using the MESE sequence of existing method 2 | T1 mean value obtained by the gold standard mapping method of existing method 1 | T1 mean value obtained by the method provided in the embodiments of the present disclosure | T1 mean value obtained by existing method 4 |
|---|---|---|---|---|---|---|---|
| Tube 1 | 44.32 | 44.06 | 43.39 | 60.69 | 537.81 | 540.91 | 585.95 |
| Tube 2 | 48.71 | 48.84 | 47.06 | 68.00 | 511.13 | 509.08 | 549.21 |
| Tube 3 | 55.90 | 56.20 | 53.73 | 81.76 | 524.01 | 517.76 | 565.82 |
| Tube 4 | 68.05 | 68.17 | 62.77 | 103.22 | 504.55 | 495.66 | 544.05 |

It can be Seen from Table 1 that:

1) With regard to the T2 values, the T2 values obtained by the method provided in the embodiments of the present disclosure deviate by less than 1% from the T2 values obtained by the gold standard mapping method of existing method 2, wherein the T2 values obtained by the MESE sequence of existing method 2 exhibit an obvious T2 value deviation; existing method 4 underestimates the T2 values, and the deviation is larger when T2 is higher.

2) With regard to the T1 values, the method provided in the embodiments of the present disclosure is more accurate than existing method 4, and has a deviation of 2% compared with the gold standard T1 mapping method of existing method 1.

Figure 4:
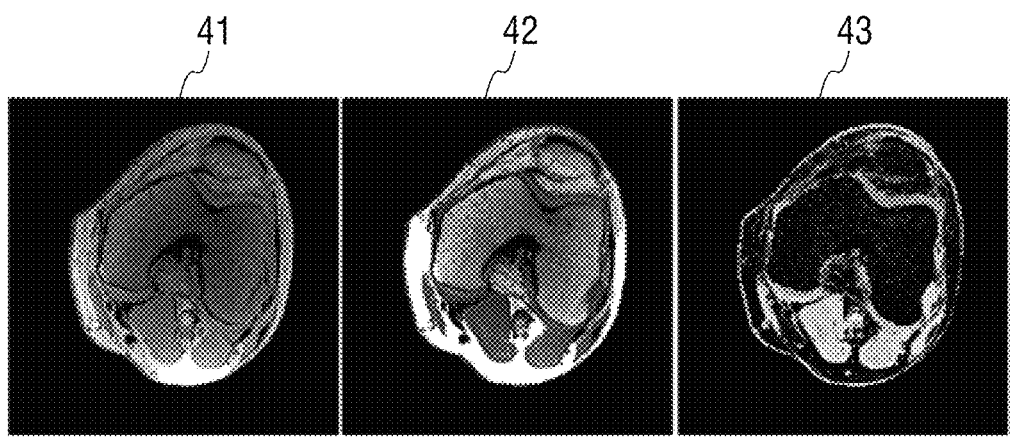
FIG. 4 shows an $M_{0,SPGR}$ map, an $M_{0,DESS}$ map and an MT weighted map obtained using the method according to exemplary embodiments of the present disclosure for four sets of knee images of a healthy volunteer obtained by acquisition: an SPGR image 1, an SPGR image 2, a DESS $F_{0,0}$ image and a DESS $F_{-1,0}$ image.

FIG. 4 shows an $M_{0,SPGR}$ map, an $M_{0,DESS}$ map and an MT weighted map obtained using the method provided in the embodiments of the present disclosure for the four sets of knee images of the healthy volunteer obtained by acquisition: SPGR image 1, SPGR image 2, the DESS $F_{0,0}$ image and the DESS $F_{-1,0}$ image. 41 is the $M_{0,SPGR}$ map, 42 is the $M_{0,DESS}$ map, and 43 is the MT weighted map. It can be seen that:

The $M_{0,SPGR}$ map has more uniform contrast, similar to a PD contrast image, but the $M_{0,DESS}$ map exhibits low strength in muscle and cartilage. Combining the $M_{0,SPGR}$ map 41 and the $M_{0,DESS}$ map 42, the MT weighted map 43 reflecting semi-solid large molecule content is reconstructed.

Figure 5:
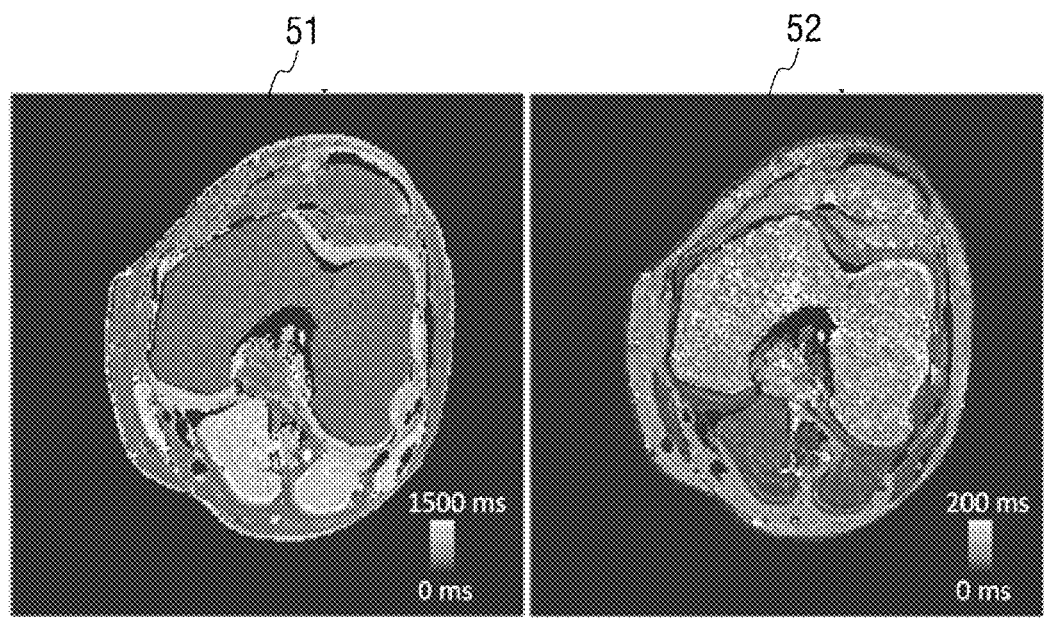
FIG. 5 shows a T1 map and a T2 map obtained using the method according to exemplary embodiments of the present disclosure for four sets of knee images of a healthy volunteer obtained by acquisition: an SPGR image 1, an SPGR image 2, a DESS $F_{0,0}$ image and a DESS $F_{-1,0}$ image.

FIG. 5 shows a T1 map and a T2 map obtained using the method provided in the embodiments of the present disclosure for the four sets of knee images of the healthy volunteer obtained by acquisition: SPGR image 1, SPGR image 2, the DESS $F_{0,0}$ image and the DESS $F_{-1,0}$ image. 51 is the T1 map, and 52 is the T2 map. It can be seen that there is similar high-strength noise in the bones; these artefacts may be caused by the fine structure of trabecular bone.

It can be seen from the above experiment that the error in the T1 and T2 values obtained using the method provided in the embodiments of the present disclosure is less than 2% and 1%, respectively. Both of these errors are reduced by ⅘, and are lower than in the existing methods, while the scan time is the same as in existing method 4 (in which T1 is obtained first by SPGR and T2 is then obtained by DESS), so there will not be any extra scan time added; compared with the gold standard mapping methods of existing methods 1 and 2, the scan time can be reduced by more than half.

Figure 6:
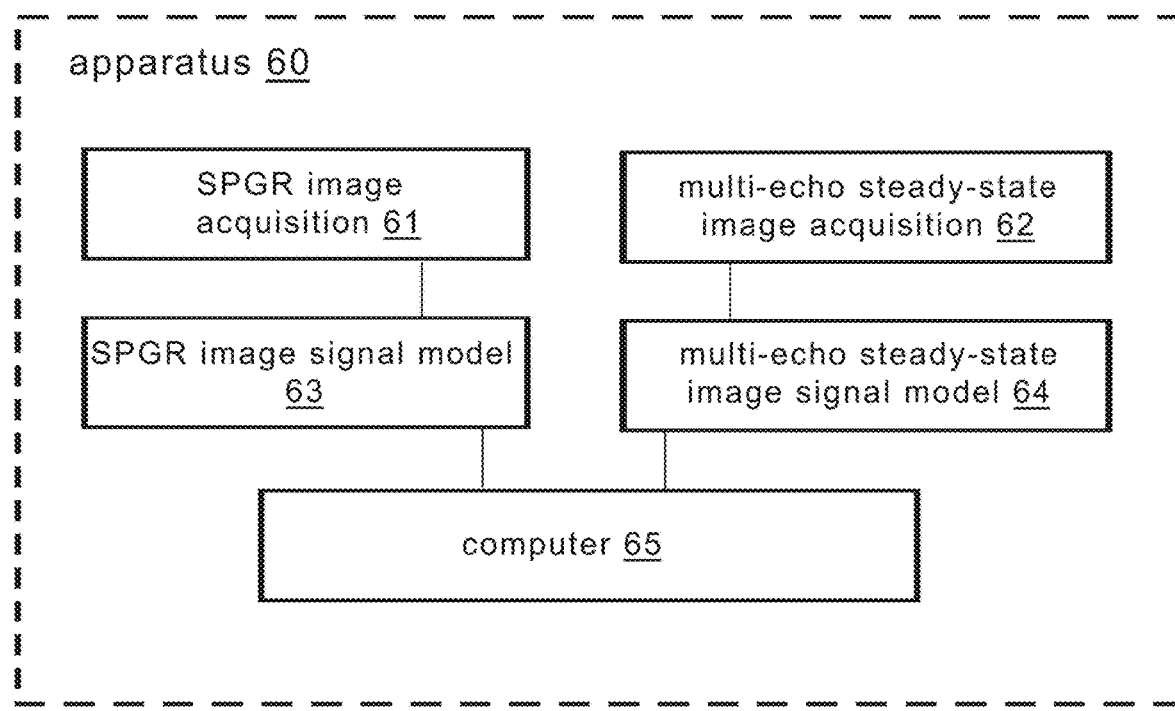
FIG. 6 is an apparatus adapted for quantitative detection of parameters in MRI according to an exemplary embodiment of the present disclosure.

FIG. 6 is a structural schematic diagram of an apparatus 60 for quantitative detection of parameters in MRI according to an embodiment of the present disclosure. The apparatus 60 may include an SPGR image acquisition module 61, a multi-echo steady-state image acquisition module 62, an SPGR image signal equation establishing and applying module 63, a multi-echo steady-state image signal equation establishing and applying module 64, and a computing module (computer) 65. In an exemplary embodiment, the apparatus 60 includes processing circuitry that is configured to perform one or more functions and/or operations of the apparatus 60. In an exemplary embodiment, one or more components of the apparatus 60 (e.g. 61-65) includes processing circuitry that is configured to perform one or more respective functions and/or operations of the component(s). In an exemplary embodiment, one or more of the modules are program modules including computer-executable instructions and which are embodied in one or more memory units (e.g. of the apparatus 60). The function(s) of the modules are performed when the computer-executable instructions are executed one or more processors of the apparatus 60.

In an exemplary embodiment, the SPGR image acquisition module 61 is configured to acquire a first SPGR image and a second SPGR image of target tissue, wherein the first SPGR image and second SPGR image are obtained by using an SPGR sequence with a first flip angle and a second flip angle respectively to scan the target tissue, the first flip angle and second flip angle being different.

In an exemplary embodiment, the multi-echo steady-state image acquisition module 62 is configured to acquire at least one multi-echo steady-state $F_0$ image and at least one multi-echo steady-state $F_{-1}$ image of the target tissue, wherein the multi-echo steady-state $F_0$ image and the multi-echo steady-state $F_{-1}$ image are obtained by using a multi-echo steady-state sequence to scan the target tissue, the multi-echo steady-state $F_0$ image is used to describe a magnetization signal formed just after excitation, and the multi-echo steady-state $F_{-1}$ image is used to describe a magnetization signal refocused just before excitation.

In an exemplary embodiment, the SPGR image signal equation establishing and applying module 63 is configured to obtain an SPGR image signal equation based on the extended phase graph theory, and apply this equation to the first SPGR image and second SPGR image acquired by the SPGR image acquisition module 61, wherein the SPGR image signal equation describes an equality relation between an SPGR signal value of each voxel of the target tissue on the SPGR image and the following 8 parameters: the SPGR proton density of each voxel of the target tissue, the longitudinal relaxation time of each voxel, the transverse relaxation time of each voxel, the repetition time corresponding to the SPGR image, the flip angle of each voxel for the SPGR image, the RF spoiled RF pulse phase difference increment, the echo time corresponding to the SPGR image and the transverse relaxation time of each voxel caused by magnetic field inhomogeneity.

In an exemplary embodiment, the multi-echo steady-state image signal equation establishing and applying module 64 is configured to establish a multi-echo steady-state $F_0$ image signal equation and a multi-echo steady-state $F_{-1}$ image signal equation based on the extended phase graph theory, apply the multi-echo steady-state $F_0$ image signal equation to the at least one multi-echo steady-state $F_0$ image acquired by the multi-echo steady-state image acquisition module 62, and apply the multi-echo steady-state $F_{-1}$ image signal equation to the at least one multi-echo steady-state $F_{-1}$ image acquired by the multi-echo steady-state image acquisition module 62, wherein the multi-echo steady-state $F_0$ image signal equation describes an equality relation between an $F_0$ signal value of each voxel of the target tissue on the multi-echo steady-state $F_0$ image and the following 7 parameters: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state $F_0$ image and the transverse relaxation time of each voxel caused by magnetic field inhomogeneity; and the multi-echo steady-state $F_{-1}$ image signal equation describes an equality relation between an $F_{-1}$ signal value of each voxel of the target tissue on the multi-echo steady-state $F_{-1}$ image and the following: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state $F_{-1}$ image and the transverse relaxation time of each voxel caused by magnetic field inhomogeneity.

In an exemplary embodiment, the computing module (computer) 65 is configured to obtain (e.g. generate or otherwise determine) an SPGR proton density map, a multi-echo steady-state proton density map, a longitudinal relaxation time map and a transverse relaxation time map of the target tissue by solving, based on the signal equation of the first SPGR image and the signal equation of the second SPGR image obtained by the SPGR image signal equation establishing and applying module 63, and the signal equation of the at least one multi-echo steady-state $F_0$ image and the signal equation of the at least one multi-echo steady-state $F_{-1}$ image obtained by the multi-echo steady-state image signal equation establishing and applying module 64. In an exemplary embodiment, the apparatus 60 may output an electronic signal representing the map(s) and/or other information determined by the apparatus 60, and/or may store the map(s) and/or information in an internal memory of the apparatus 60. In one or more aspects, the map(s) may be displayed on a display of the MRI system and/or otherwise output by an output interface of the MRI system. Additionally, or alternatively, the map(s) may be transmitted to an external display or other output interface, and/or stored in an external memory.

In an exemplary embodiment, the SPGR image signal equation obtained by the SPGR image signal equation establishing and applying module 63 is:

$$S_{SPGR,l}(v) M_{0,SPGR}(v) \cdot$$

$$f_{EPG}(T1(v), T2(v), TR_{SPGR,l}, \alpha_{SPGR,l}(v), \Psi) \cdot \exp\left(-\frac{TE_{SPGR,l}}{T2(v)} - \frac{TE_{SPGR,l}}{T2'(v)}\right)$$

where v is the sequence number of a voxel on the target tissue; l is the sequence number of the SPGR image, such that when l=1, this corresponds to the first SPGR image, and when l=2, this corresponds to the second SPGR image; $S_{SPGR,l}(v)$ is the signal value of the voxel v on the SPGR image l, $M_{0,SPGR}(v)$ is the SPGR proton density of the voxel v, $f_{EPG}(\ )$ is a predefined steady-state $F_0$ function, T1(v) is the longitudinal relaxation time of the voxel v, T2(v) is the transverse relaxation time of the voxel v, $TR_{SPGR,l}$ is the repetition time corresponding to the SPGR image l, $\alpha_{SPGR,l}(v)$ is the flip angle of the voxel v for the SPGR image l, Y is the RF spoiled RF pulse phase difference increment, $TE_{SPGR,l}$ is the echo time corresponding to the SPGR image l, and T2' (v) is the transverse relaxation time of the voxel v caused by magnetic field inhomogeneity.

In an exemplary embodiment, the multi-echo steady-state $F_0$ image signal equation obtained by the multi-echo steady-state image signal equation establishing and applying module 64 is:

$$F_{0,n}(v) = M_{0,DESS}(v) \cdot \tan\left(\frac{\alpha_{DESS}(v)}{2}\right) \cdot$$

$$(1 - (E1(v) - \cos \alpha_{DESS}(v)) \cdot r(v)) \cdot \exp\left(-\frac{TE_{0,n}}{T2(v)} - \frac{TE_{0,n}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = (1 - E2^2(v)) \cdot (p^2(v) - q^2(v))^{\frac{-1}{2}}$$

where n is the sequence number, in a multi-echo steady-state sequence, of the echo time corresponding to the current multi-echo steady-state $F_0$ image, v is the sequence number of a voxel on the target tissue, $F_{0,n}(v)$ is the signal value of the voxel v on the current multi-echo steady-state $F_0$ image, $M_{0,DESS}(v)$ is the multi-echo steady-state proton density of the voxel v, $\alpha_{DESS}(v)$ is the multi-echo steady-state flip angle of the voxel v, $TE_{0,n}$ is the echo time of the voxel v for the current multi-echo steady-state $F_0$ image, $TR_{DESS}$ is the repetition time corresponding to the multi-echo steady-state image, T1(v) is the longitudinal relaxation time of the voxel v, T2(v) is the transverse relaxation time of the voxel v, and T2'(v) is the transverse relaxation time of the voxel v caused by magnetic field inhomogeneity.

In an exemplary embodiment, the multi-echo steady-state $F_{-1}$ image signal equation obtained by the multi-echo steady-state image signal equation establishing and applying module 64 is:

$$F_{-1,m}(v) = M_{0,DESS}(v) \cdot \tan\left(\frac{\alpha_{DESS}(v)}{2}\right) \cdot$$

$$\frac{1 - (1 - E1(v) \cdot \cos \alpha_{DESS}(v)) \cdot r(v)}{E2(v)} \cdot \exp\left(-\frac{TR_{DESS} - TE_{-1,m}}{T2(v)} - \frac{TE_{-1,m}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = (1 - E2^2(v)) \cdot (p^2(v) - q^2(v))^{\frac{-1}{2}}$$

where m is the sequence number, in a multi-echo steady-state sequence, of the echo time corresponding to the current multi-echo steady-state $F_{-1}$ image, v is the sequence number of a voxel on the target tissue, $F_{-1,n}(v)$ is the signal value of the voxel v on the current multi-echo steady-state $F_{-1}$ image, $M_{0,DESS}(v)$ is the multi-echo steady-state proton density of the voxel v, $\alpha_{DESS}(v)$ is the multi-echo steady-state flip angle of the voxel v, TE-1,m is the echo time of the voxel v for the current multi-echo steady-state $F_{-1}$ image, $TR_{DESS}$ is the repetition time corresponding to the multi-echo steady-state image, T1(v) is the longitudinal relaxation time of the voxel v, T2(v) is the transverse relaxation time of the voxel v, and T2' (v) is the transverse relaxation time of the voxel v caused by magnetic field inhomogeneity.

In an exemplary embodiment, after obtaining the SPGR proton density map, multi-echo steady-state proton density map, longitudinal relaxation time map and transverse relaxation time map of the target tissue by solving, the computing module 65 is further configured to: obtaining a MT (magnetization transfer) weighted map of the target tissue by computation, based on the SPGR proton density map and multi-echo steady-state proton density map of the target tissue, by means of the following equality:

$$MTR(v)=(M_{0,SPGR}(v)-C \cdot M_{0,DESS}(v))/M_{0,SPGR}(v),$$

where v is the sequence number of a voxel on the target tissue, MTR(v) is the MT weight value of the voxel v, $M_{0,SPGR}(v)$ is the SPGR proton density of the voxel v, $M_{0,DESS}(v)$ is the multi-echo steady-state proton density of the voxel v; and C is a preset constant.

In an exemplary embodiment, when obtaining the SPGR proton density map, multi-echo steady-state proton density map, longitudinal relaxation time map and transverse relaxation time map of the target tissue by solving, the computing module 65 is further configured to:

obtain a T2' (transverse relaxation time caused by magnetic field inhomogeneity) map of the target tissue by solving.

In an exemplary embodiment, after the computing module 65 has obtained the T2' map of the target tissue by solving, the following is further included:

based on the transverse relaxation time map and the T2' map of the target tissue, and by means of the following equality:

$$\frac{1}{T2^*(v)} = \frac{1}{T2(v)} + \frac{1}{T2'(v)}$$

obtaining an effective transverse relaxation time T2* map of the target tissue by computation, where v is the sequence number of a voxel on the target tissue, T2*(v) is the effective transverse relaxation time of the voxel v, T2(v) is the transverse relaxation time of the voxel v, and T2' (v) is the transverse relaxation time of the voxel v caused by magnetic field inhomogeneity.

In an exemplary embodiment, at the same time as acquiring the first SPGR image of the target tissue, the SPGR image acquisition module 61 is further configured to: acquire a B1 map of the target tissue, and obtain a flip angle of each voxel for the first SPGR image by computation according to the B1 map;

at the same time as acquiring the second SPGR image of the target tissue, the SPGR image acquisition module 61 is further configured to obtain a flip angle of each voxel for the second SPGR image by computation according to the B1 map;

at the same time as the multi-echo steady-state image acquisition module 62 acquires at least one multi-echo steady-state $F_0$ image and at least one multi-echo steady-state $F_{-1}$ image of the target tissue, the following is further included: obtaining a multi-echo steady-state flip angle of each voxel by computation according to the B1 map.

The embodiments of the present disclosure further provide an MR scanner, comprising the apparatus 60 for quantitative detection of parameters in MRI as described above.

The embodiments above are exemplary embodiments of the present disclosure, which are not intended to limit it. Any amendments, equivalent substitutions or improvements etc. made within the spirit and principles of the present disclosure shall be included in the scope of protection thereof.

To enable those skilled in the art to better understand the solution of the present disclosure, the technical solution in the embodiments of the present disclosure is described clearly and completely below in conjunction with the drawings in the embodiments of the present disclosure. Obviously, the embodiments described are only some, not all, of the embodiments of the present disclosure. All other embodiments obtained by those skilled in the art on the basis of the embodiments in the present disclosure without any creative effort should fall within the scope of protection of the present disclosure.

It should be noted that the terms "first", "second", etc. in the description, claims and abovementioned drawings of the present disclosure are used to distinguish between similar objects, but not necessarily used to describe a specific order or sequence. It should be understood that data used in this way can be interchanged as appropriate so that the embodiments of the present disclosure described here can be implemented in an order other than those shown or described here. In addition, the terms "comprise" and "have" and any variants thereof are intended to cover non-exclusive inclusion. For example, a process, method, system, product or equipment comprising a series of steps or modules or units is not necessarily limited to those steps or modules or units which are clearly listed, but may comprise other steps or modules or units which are not clearly listed or are intrinsic to such processes, methods, products or equipment.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computer). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general-purpose computer.

For the purposes of this discussion, the term "processing circuitry" shall be understood to be circuit(s) or processor(s), or a combination thereof. A circuit includes an analog circuit, a digital circuit, data processing circuit, other structural electronic hardware, or a combination thereof. A processor includes a microprocessor, a digital signal processor (DSP), central processor (CPU), application-specific instruction set processor (ASIP), graphics and/or image processor, multi-core processor, or other hardware processor. The processor may be "hard-coded" with instructions to perform corresponding function(s) according to aspects described herein. Alternatively, the processor may access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, the memory is any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

One or more aspects discussed herein may be embodied in computer-usable or readable data and/or computer-executable instructions, such as in one or more program modules, executed by one or more processors. Generally, program modules include routines, programs, objects, components, data structures, and the like that perform particular tasks or implement particular abstract data types when executed by a processor in a computer or other device. The modules may be written in a source code programming language that is subsequently compiled for execution, or may be written in a scripting language. The computer executable instructions may be stored on a computer readable medium such as a hard disk, optical disk, removable storage media, solid-state memory, RAM, and the like. As will be appreciated by one of skill in the art, the functionality of the program modules may be combined or distributed as desired in various embodiments. In addition, the functionality may be embodied in whole or in part in firmware or hardware equivalents such as integrated circuits, field programmable gate arrays (FPGA), and the like.

REFERENCE LIST

101~105 step
21 RF pulse
22 readout gradient strength
23 Phase encoding gradient strength
24 Layered Encoding Gradient Strength
31 The experimental result of the T1 map that adopts the method according to exemplary embodiments
32 The experimental results of the T2 map obtained by the existing method 4
33 The experimental results of the T2 map obtained by using the MESE sequence of the existing method 2
34 The experimental result of the T1 map that adopts the method according to exemplary embodiments
35 The experimental results of the T1 map obtained by the existing method 4
41 $M_{0,SPGR}$ map
42 $M_{0,DESS}$ graph
43 MT weighted graph
51 T1 map
52 T2 map
60 Parameter quantitative detection device in MRI
61 SPGR image acquisition module
62 Multi-echo steady-state image acquisition module
63 Signal equation establishment and application module of SPGR image
64 Signal equation establishment and application module for multi-echo steady-state images
65 computing module (computer)

The invention claimed is:

1. A method for quantitative detection of parameters in magnetic resonance imaging (MRI), the method comprising:

acquiring, by a magnetic resonance (MR) scanner and using a spoiled gradient echo sequence with a first flip angle and a second flip angle respectively to scan a target tissue, a first spoiled gradient echo image and a second spoiled gradient echo image of the target tissue, wherein the first flip angle and second flip angle are different;

acquiring, by the MR scanner and using a multi-echo steady-state sequence to scan the target tissue, at least one multi-echo steady-state first magnetization image and at least one multi-echo steady-state second magnetization image of the target tissue, wherein the multi-echo steady-state first magnetization image describes a magnetization signal formed just after excitation and the multi-echo steady-state second magnetization image describes a magnetization signal refocused just before excitation;

based on an extended phase graph theory, determining, by the MR scanner, signal equations corresponding to the first and second spoiled gradient echo images, the at least one multi-echo steady-state first magnetization image, and the at least one multi-echo steady-state second magnetization image;

based on the determined signal equations of the first and second spoiled gradient echo images, the determined signal equation of the at least one multi-echo steady-state first magnetization image, and the determined signal equation of the at least one multi-echo steady-state second magnetization image: determining, by the MR scanner, a spoiled gradient echo proton density map, a multi-echo steady-state proton density map, a longitudinal relaxation time map and a transverse relaxation time map of the target tissue; and providing one or more electronic output signals representing the spoiled gradient echo proton density map, the multi-echo steady-state proton density map, the longitudinal relaxation time map, and/or the transverse relaxation time map of the target tissue.

2. The method as claimed in claim 1, wherein the signal equations of the first and second spoiled gradient echo images are: an equality relation between a spoiled gradient echo signal value of each voxel of the target tissue on the spoiled gradient echo image and the following parameters: the spoiled gradient echo proton density of each voxel of the target tissue, the longitudinal relaxation time of each voxel, the transverse relaxation time of each voxel, the repetition time corresponding to the spoiled gradient echo image, the flip angle of each voxel for the spoiled gradient echo image, the RF spoiled RF pulse phase difference increment, the echo time corresponding to the spoiled gradient echo image, and the transverse relaxation time of each voxel caused by magnetic field inhomogeneity.

3. The method as claimed in claim 1, wherein the signal equations of the first and second spoiled gradient echo images are:

$$S_{SPGR,l}(v) = M_{0,SPGR}(v) \cdot$$

$$f_{EPG}(T1(v), T2(v), TR_{SPGR,l}, \alpha_{SPGR,l}(v), \Psi) \cdot \exp\left(-\frac{TE_{SPGR,l}}{T2(v)} - \frac{TE_{SPGR,l}}{T2'(v)}\right)$$

where v is the sequence number of a voxel on the target tissue; l is the sequence number of the spoiled gradient echo image, such that when l=1, this corresponds to the first spoiled gradient echo image, and when l=2, this corresponds to the second spoiled gradient echo image; $S_{SPGR,l}(v)$ is the signal value of the voxel v on the spoiled gradient echo image l, $M_{0,SPGR}$ v is the spoiled gradient echo proton density of the voxel v, $f_{EPG}$ ( ) is a predefined steady-state first magnetization function, T1(v) is the longitudinal relaxation time of the voxel v, T2(v) is the transverse relaxation time of the voxel v, $TR_{SPGR,l}$ is the repetition time corresponding to the spoiled gradient echo image l, $\alpha_{SPGR,l}(v)$ is the flip angle of the voxel v for the spoiled gradient echo image l, $\Psi$ is the RF spoiled RF pulse phase difference increment, $TE_{SPGR,l}$ is the echo time corresponding to the spoiled gradient echo image l, and T2'(v) is the transverse relaxation time of the voxel v caused by magnetic field inhomogeneity.

4. The method as claimed in claim 1, wherein:
the signal equation of the multi-echo steady-state first magnetization image is: an equality relation between a first magnetization signal value of each voxel of the target tissue on the multi-echo steady-state first magnetization image and the following parameters: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state first magnetization image, and the transverse relaxation time of each voxel caused by magnetic field inhomogeneity; and
the signal equation of the multi-echo steady-state second magnetization image is: an equality relation between a second magnetization signal value of each voxel of the target tissue on the multi-echo steady-state second magnetization image and the following: the multi-echo steady-state proton density of each voxel of the target tissue, the longitudinal relaxation time of each voxel, the transverse relaxation time of each voxel, the repetition time corresponding to the multi-echo steady-state image, the multi-echo steady-state flip angle of each voxel, the echo time corresponding to the multi-echo steady-state second magnetization image, and the transverse relaxation time of each voxel caused by magnetic field inhomogeneity.

5. The method as claimed in claim 1, wherein the signal equation of the multi-echo steady-state first magnetization image is:

$$F_{0,n}(v) = M_{0,DESS}(v) \cdot \tan\left(\frac{\alpha_{DESS}(v)}{2}\right) \cdot$$

$$(1 - (E1(v) - \cos \alpha_{DESS}(v)) \cdot r(v)) \cdot \exp\left(-\frac{TE_{0,n}}{T2(v)} - \frac{TE_{0,n}}{T2'(v)}\right), \text{wherein;}$$

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = (1 - E2^2(v)) \cdot (p^2(v) - q^2(v))^{\frac{-1}{2}}$$

where n is the sequence number, in a multi-echo steady-state sequence, of the echo time corresponding to the current multi-echo steady-state first magnetization image, v is the sequence number of a voxel on the target tissue, $F_{0,n}(v)$ is the signal value of the voxel v on the current multi-echo steady-state first magnetization image, $M_{0,DESS}(v)$ is the multi-echo steady-state proton density of the voxel v, $\alpha_{DESS}(v)$ is the multi-echo steady-state flip angle of the voxel v, $TE_{0,n}$ is the echo time of the voxel v for the current multi-echo steady-state first magnetization image, $TR_{DESS}$ is the repetition time corresponding to the multi-echo steady-state image, T1(v) is the longitudinal relaxation time of the voxel v, T2(v) is the transverse relaxation time of the voxel v, and T2'(v) is the transverse relaxation time of the voxel v caused by magnetic field inhomogeneity.

6. The method as claimed in claim 1, wherein the signal equation of the multi-echo steady-state second magnetization image is:

$$F_{-1,m}(v) = M_{0,DESS}(v) \cdot \tan\left(\frac{\alpha_{DESS}(v)}{2}\right) \cdot$$

$$\frac{1 - (1 - E1(v) \cdot \cos \alpha_{DESS}(v)) \cdot r(v)}{E2(v)} \cdot \exp\left(-\frac{TR_{DESS} - TE_{-1,m}}{T2(v)} - \frac{TE_{-1,m}}{T2'(v)}\right)$$

wherein:

$$E1(v) = \exp\left(\frac{-TR_{DESS}}{T1(v)}\right)$$

$$E2(v) = \exp\left(\frac{-TR_{DESS}}{T2(v)}\right)$$

$$p(v) = 1 - E1(v) \cdot \cos \alpha_{DESS}(v) - E2^2(v) \cdot (E1(v) - \cos \alpha_{DESS}(v))$$

$$q(v) = E2(v) \cdot (1 - E1(v)) \cdot (1 + \cos \alpha_{DESS}(v))$$

$$r(v) = (1 - E2^2(v)) \cdot (p^2(v) - q^2(v))^{\frac{-1}{2}}$$

where m is the sequence number, in a multi-echo steady-state sequence, of the echo time corresponding to the current multi-echo steady-state second magnetization image, v is the sequence number of a voxel on the target tissue, $F_{-1,n}(v)$ is the signal value of the voxel v on the current multi-echo steady-state second magnetization image, $M_{0,DESS}(v)$ is the multi-echo steady-state proton density of the voxel v, $\alpha_{DESS}(v)$ is the multi-echo steady-state flip angle of the voxel v, $TE_{-1,m}$ is the echo time of the voxel v for the current multi-echo steady-state second magnetization image, $TR_{DESS}$ is the repetition time corresponding to the multi-echo steady-state image, T1(v) is the longitudinal relaxation time of the voxel v, T2(v) is the transverse relaxation time of the voxel v, and T2'(v) is the transverse relaxation time of the voxel v caused by magnetic field inhomogeneity.

7. The method as claimed in claim 1, wherein, after determining the spoiled gradient echo proton density map, the multi-echo steady-state proton density map, the longitudinal relaxation time map, and the transverse relaxation time map of the target tissue, the method further comprises:

determining, by the MR scanner, a magnetization transfer weighted map of the target tissue by computation, using the spoiled gradient echo proton density map and multi-echo steady-state proton density map of the target tissue, and based on the following equality:

$MTR(v) = (M_{0,SPGR}(v) - C \cdot M_{0,DESS}(v))/M_{0,SPGR}(v)$, where v is the sequence number of a voxel on the target tissue, $MTR(v)$ is the magnetization transfer weight value of the voxel v, $M_{0,SPGR}(v)$ is the spoiled gradient echo proton density of the voxel v, $M_{0,DESS}(v)$ is the multi-echo steady-state proton density of the voxel v, and C is a preset constant.

8. The method as claimed in claim 1, wherein determining the spoiled gradient echo proton density map, the multi-echo steady-state proton density map, the longitudinal relaxation time map, and the transverse relaxation time map of the target tissue further comprises:

determining, by the MR scanner, a map of the transverse relaxation time T2' of the target tissue caused by magnetic field inhomogeneity.

9. The method as claimed in claim 8, wherein, after determining the T2' map of the target tissue, the method further comprises:

using the transverse relaxation time map and the T2' map of the target tissue, and based on the following equality:

$$\frac{1}{T2^*(v)} = \frac{1}{T2(v)} + \frac{1}{T2'(v)}$$

determining, by the MR scanner, an effective transverse relaxation time T2* map of the target tissue by computation, where v is the sequence number of a voxel on the target tissue, $T2^*(v)$ is the effective transverse relaxation time of the voxel v, $T2(v)$ is the transverse relaxation time of the voxel v, and $T2'(v)$ is the transverse relaxation time of the voxel v caused by magnetic field inhomogeneity.

10. The method as claimed in claim 1, wherein:

simultaneously with acquiring a first spoiled gradient echo image of target tissue, the method further comprises: acquiring, by the MR scanner, a receiving radio-frequency (RF) field B1 map of the target tissue, and computing a flip angle of each voxel for the first spoiled gradient echo image according to the B1 map;

simultaneously with acquiring a second spoiled gradient echo image of the target tissue, the method further comprises: computing, by the MR scanner, a flip angle of each voxel for the second spoiled gradient echo image according to the B1 map;

simultaneously with acquiring at least one multi-echo steady-state first magnetization image and at least one multi-echo steady-state second magnetization image of the target tissue, the method further comprises: computing, by the MR scanner, a multi-echo steady-state flip angle of each voxel according to the B1 map.

11. A non-transitory computer-readable storage medium with an executable program stored thereon, that when executed, instructs a processor to perform the method of claim 1.

12. An apparatus comprising:
one or more processors; and
memory storing instructions that, when executed by the one or more processors, configure the apparatus to:
acquire, using a spoiled gradient echo sequence with a first flip angle and a second flip angle respectively to scan a target tissue, a first spoiled gradient echo image and a second spoiled gradient echo image of the target tissue, wherein the first flip angle and second flip angle are different;
acquire, using a multi-echo steady-state sequence to scan the target tissue, at least one multi-echo steady-state first magnetization image and at least one multi-echo steady-state second magnetization image of the target tissue, wherein the multi-echo steady-state first magnetization image describes a magnetization signal formed just after excitation and the multi-echo steady-state second magnetization image describes a magnetization signal refocused just before excitation;
based on an extended phase graph theory, determine signal equations corresponding to the first and second spoiled gradient echo images, the at least one multi-echo steady-state first magnetization image, and the at least one multi-echo steady-state second magnetization image;
based on the determined signal equations of the first and second spoiled gradient echo images, the determined signal equation of the at least one multi-echo steady-state first magnetization image, and the determined signal equation of the at least one multi-echo steady-state second magnetization image: determine a spoiled gradient echo proton density map, a multi-echo steady-state proton density map, a longitudinal relaxation time map and a transverse relaxation time map of the target tissue; and
provide one or more electronic signals representing the spoiled gradient echo proton density map, the multi-echo steady-state proton density map, the longitudinal relaxation time map, and/or the transverse relaxation time map of the target tissue as an output of the one or more processors.

13. A magnetic resonance scanner comprising the apparatus as claimed in claim 12.

14. An apparatus for quantitative detection of parameters in MRI, comprising:
a spoiled gradient echo image acquisition module configured to acquire, using a spoiled gradient echo sequence with a first flip angle and a second flip angle respectively to scan a target tissue, a first spoiled gradient echo image and a second spoiled gradient echo image of the target tissue, wherein the first flip angle and second flip angle being different;
a multi-echo steady-state image acquisition module configured to acquire, using a multi-echo steady-state sequence to scan the target tissue, at least one multi-echo steady-state first magnetization image and at least one multi-echo steady-state second magnetization image of the target tissue, wherein the multi-echo steady-state first magnetization image describes a magnetization signal formed just after excitation, and the multi-echo steady-state second magnetization image describes a magnetization signal refocused just before excitation;
a spoiled gradient echo image signal equation establishing and applying module configured to determine a spoiled gradient echo image signal equation based on an extended phase graph theory, and apply the spoiled gradient echo image signal equation to the first spoiled gradient echo image and the second spoiled gradient echo image;

a multi-echo steady-state image signal equation establishing and applying module configured to determine a multi-echo steady-state first magnetization image signal equation and a multi-echo steady-state second magnetization image signal equation based on the extended phase graph theory, apply the multi-echo steady-state first magnetization image signal equation to the at least one multi-echo steady-state first magnetization image, and apply the multi-echo steady-state second magnetization image signal equation to the at least one multi-echo steady-state second magnetization image; and a computer configured to:

determine, based on the spoiled gradient echo image signal equation of the first spoiled gradient echo image, the spoiled gradient echo image signal equation of the second spoiled gradient echo image, the multi-echo steady-state first magnetization image signal equation of the at least one multi-echo steady-state first magnetization image, and the multi-echo steady-state second magnetization image signal equation of the at least one multi-echo steady-state second magnetization image: a spoiled gradient echo proton density map, a multi-echo steady-state proton density map, a longitudinal relaxation time map, and a transverse relaxation time map of the target tissue by solving; and provide one or more electronic signals representing the spoiled gradient echo proton density map, the multi-echo steady-state proton density map, the longitudinal relaxation time map, and/or the transverse relaxation time map of the target tissue as an output of the computer.

15. A magnetic resonance scanner comprising the apparatus as claimed in claim 14.

* * * * *